United States Patent
Campbell et al.

(10) Patent No.: US 7,841,385 B2
(45) Date of Patent: Nov. 30, 2010

(54) DUAL-CHAMBER FLUID PUMP FOR A MULTI-FLUID ELECTRONICS COOLING SYSTEM AND METHOD

(75) Inventors: Levi A. Campbell, Poughkeepsie, NY (US); Richard C. Chu, Hopewell Junction, NY (US); Michael J. Ellsworth, Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1050 days.

(21) Appl. No.: 11/426,431

(22) Filed: Jun. 26, 2006

(65) Prior Publication Data

US 2007/0295481 A1     Dec. 27, 2007

(51) Int. Cl.
*F28F 7/00*     (2006.01)
*F04F 1/18*     (2006.01)
(52) U.S. Cl. .................. 165/80.4; 165/104.33
(58) Field of Classification Search ............... 165/80.4, 165/104.33, 46, 121; 417/112, 123, 413.1, 417/413.2
See application file for complete search history.

(56) References Cited

U.S. PATENT DOCUMENTS

| | | | |
|---|---|---|---|
| 2,928,409 A | | 3/1960 | Johnson et al. ............... 137/82 |
| 3,029,743 A | * | 4/1962 | Johns ......................... 417/322 |
| 3,406,244 A | | 10/1968 | Oktay ......................... 174/15 |

(Continued)

FOREIGN PATENT DOCUMENTS

JP     2001050164 A  *  2/2001

OTHER PUBLICATIONS

Campbell et al., "Cooling Apparatus, Cooled electronic Module and Methods of Fabrication Thereof Employing a Thermally Conductive Return Manifold Structure Sealed to the Periphery of a Surface to be Cooled", U.S. Appl. No. 11/420,421, filed May 25, 2006.

(Continued)

*Primary Examiner*—Tho V Duong
(74) *Attorney, Agent, or Firm*—Geraldine Monteleone, Esq.; Kevin P. Radigan, Esq.; Heslin Rothenberg Farley & Mesiti P.C.

(57) ABSTRACT

A dual-chamber fluid pump is provided for a multi-fluid electronics cooling system and method. The pump has a first fluid path for pumping a first fluid coolant and a second fluid path for pumping a second fluid coolant, with the first fluid path including a first pumping chamber and the second fluid path including a second pumping chamber. The first and second pumping chambers are separated by at least one diaphragm, and an actuator is coupled to the diaphragm for transitioning the diaphragm between a first position and a second position. Transitioning of the diaphragm to the first position pumps first fluid coolant from the first pumping chamber while concurrently drawing second fluid coolant into the second pumping chamber, and transitioning of the diaphragm to the second position pumps second fluid coolant from the second pumping chamber while concurrently drawing first fluid coolant into the first pumping chamber.

13 Claims, 7 Drawing Sheets

U.S. PATENT DOCUMENTS

| | | | | |
|---|---|---|---|---|
| 3,417,814 A | | 12/1968 | Oktay | 165/105 |
| 3,520,641 A | | 7/1970 | Casey et al. | 417/412 |
| 3,606,592 A | * | 9/1971 | Madurski et al. | 417/413.1 |
| 4,468,177 A | | 8/1984 | Strimling | 417/413 |
| 4,524,466 A | | 6/1985 | Hall et al. | 603/3 |
| 4,648,807 A | * | 3/1987 | Tippetts et al. | 417/413.2 |
| 4,697,989 A | * | 10/1987 | Perlov et al. | 417/53 |
| 4,715,435 A | * | 12/1987 | Foret | 165/120 |
| 4,939,405 A | | 7/1990 | Okuyama et al. | 310/330 |
| 5,094,594 A | | 3/1992 | Brennan | 417/322 |
| 5,131,233 A | | 7/1992 | Cray et al. | 62/64 |
| 5,215,446 A | | 6/1993 | Takahashi et al. | 417/322 |
| 5,338,164 A | * | 8/1994 | Sutton et al. | 417/413.2 |
| 5,914,856 A | | 6/1999 | Morton et al. | 361/690 |
| 6,193,905 B1 | * | 2/2001 | Yamada et al. | 252/67 |
| 6,558,127 B2 | | 5/2003 | Maruyama et al. | 417/44.1 |
| 6,565,333 B2 | | 5/2003 | Maruyama | 417/417 |
| 6,741,464 B2 | | 5/2004 | Kitano et al. | 361/687 |
| 6,884,040 B2 | | 4/2005 | Dooley | 417/53 |
| 6,940,712 B2 | | 9/2005 | Chu et al. | 361/679 |
| 6,987,668 B2 | * | 1/2006 | Kitano et al. | 361/679.47 |
| 2002/0025260 A1 | | 2/2002 | Maruyama | 417/322 |
| 2002/0175596 A1 | | 11/2002 | Garimella et al. | 310/328 |
| 2003/0173873 A1 | | 9/2003 | Bryant et al. | 310/365 |
| 2004/0042915 A1 | | 3/2004 | Rife et al. | 417/321 |
| 2004/0168447 A1 | | 9/2004 | Sugito et al. | 62/114 |
| 2005/0121171 A1 | * | 6/2005 | Mukasa et al. | 165/80.3 |
| 2005/0219288 A1 | | 10/2005 | Vogeley et al. | 347/10 |
| 2005/0219302 A1 | | 10/2005 | Vogeley | 347/19 |
| 2005/0225201 A1 | | 10/2005 | Vogeley | 310/317 |
| 2005/0225202 A1 | | 10/2005 | Vogeley et al. | 310/317 |
| 2006/0016581 A1 | * | 1/2006 | Wang et al. | 165/104.33 |
| 2006/0104031 A1 | | 5/2006 | Colgan et al. | 361/699 |
| 2007/0153480 A1 | | 7/2007 | Zhang et al. | |
| 2007/0295480 A1 | | 12/2007 | Campbell et al. | |

OTHER PUBLICATIONS

Office Action for U.S. Appl. No. 11/426,423 (U.S. Patent Publication No. 2007/0295480 A1), dated Nov. 27, 2009.

* cited by examiner

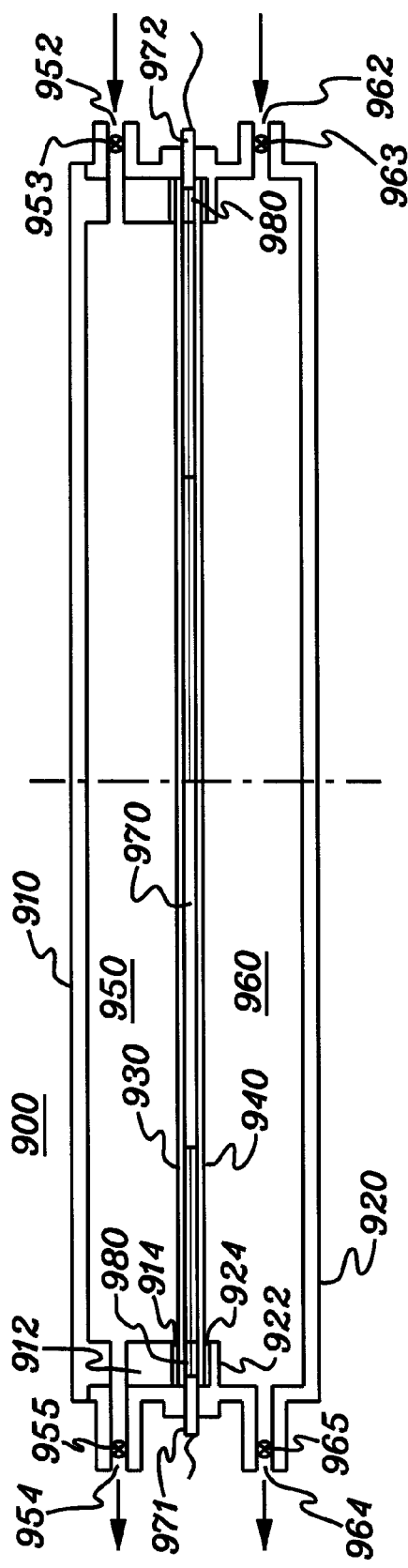
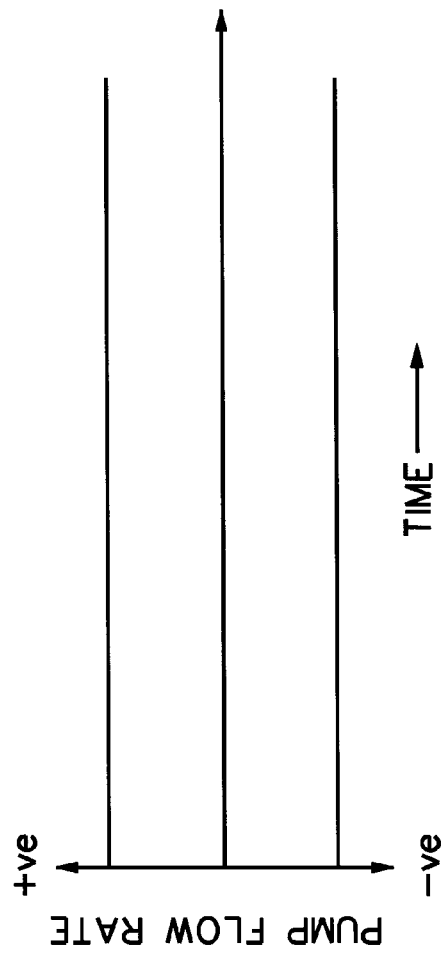
fig. 9
fig. 10

DUAL-CHAMBER FLUID PUMP FOR A MULTI-FLUID ELECTRONICS COOLING SYSTEM AND METHOD

CROSS-REFERENCE TO RELATED APPLICATION

This application contains subject matter which is related to the subject matter of the following co-filed application, which is assigned to the same assignee as this application and which is hereby incorporated herein by reference in its entirety:

"Multi-Fluid Cooling System, Cooled Electronics Module, and Methods of Fabrication Thereof", Campbell et al., Ser. No. 11/426,423, co-filed herewith.

TECHNICAL FIELD

The present invention relates generally to heat transfer mechanisms, and more particularly, to cooling systems, cooled electronics modules and methods of fabrication thereof for removing heat generated by one or more electronic devices. Still more particularly, the present invention relates to multi-fluid cooling systems and methods of cooling one or more electronic devices, and in particular, to a multi-chamber fluid pump for pumping different fluids through a multi-fluid cooling system.

BACKGROUND OF THE INVENTION

As is known, operating electronic devices produce heat. This heat must be removed from the devices in order to maintain device junction temperatures within desirable limits, with failure to remove the heat thus produced resulting in increased device temperatures, potentially leading to thermal runaway conditions. Several trends in the electronics industry have combined to increase the importance of thermal management, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Air cooling techniques are inherently limited in their ability to extract heat from an electronic device with high power density.

SUMMARY OF THE INVENTION

The need to cool current and future high heat load, high heat flux electronic devices requires development of aggressive thermal management techniques, such as liquid impingement approaches to cool the electronic devices. The concepts disclosed herein address this need for enhanced fluid-based cooling systems and methods of cooling. More particularly, enhanced pump designs are presented for use in such fluid-based cooling systems and methods.

Briefly summarized, the present invention comprises in one aspect a pump for an electronics cooling system. The pump includes a first fluid path for pumping a first fluid coolant and a second fluid path for pumping a second fluid coolant, with the first fluid path comprising a first pumping chamber and the second fluid path comprising a second pumping chamber. The pump further includes at least one diaphragm separating the first pumping chamber and the second pumping chamber, and an actuator coupled to the at least one diaphragm for transitioning the at least one diaphragm between a first position and a second position. When the pump is operational, transitioning of the at least one diaphragm to the first position pumps first fluid coolant from the first pumping chamber while concurrently drawing second fluid coolant into the second pumping chamber, and transitioning of the at least one diaphragm to the second position pumps second fluid coolant from the second pumping chamber while concurrently drawing first fluid coolant into the first pumping chamber.

In another aspect, the present invention comprises a cooled electronics system, which includes at least one fluid cooled electronics module and at least one heat exchanger for cooling fluid effluent from the at least one fluid cooled electronics module. The fluid effluent comprises a first fluid coolant and a second fluid coolant. Further, a pump is provided for pumping the first fluid coolant and the second fluid coolant to the at least one fluid cooled electronics module from the at least one heat exchanger. The pump includes a first fluid path for pumping the first fluid coolant and a second fluid path for pumping the second fluid coolant, with the first fluid path comprising a first pumping chamber and the second fluid path comprising a second pumping chamber. The pump further includes at least one diaphragm separating the first pumping chamber and the second pumping chamber, and an actuator coupled to the at least one diaphragm for transitioning the at least one diaphragm between a first position and a second position. When operational, transitioning of the at least one diaphragm to the first position pumps first fluid coolant from the first pumping chamber while concurrently drawing second fluid coolant into the second pumping chamber, and transitioning of the at least one diaphragm to the second position pumps second fluid coolant from the second pumping chamber while concurrently drawing first fluid coolant into the first pumping chamber.

In a further aspect, the present invention comprises a method of cooling at least one fluid cooled electronics module. The method includes providing a pump for pumping a first fluid coolant and a second fluid coolant to the at least one fluid cooled electronics module. The pump includes: a first fluid path for pumping the first fluid coolant and a second fluid path for pumping the second fluid coolant, the first fluid path comprising a first pumping chamber and the second fluid path comprising a second pumping chamber; at least one diaphragm separating the first pumping chamber and the second pumping chamber; and an actuator coupled to the at least one diaphragm for transitioning the at least one diaphragm between a first position and a second position, wherein transitioning of the at least one diaphragm to the first position pumps first fluid coolant from the first pumping chamber while concurrently drawing second fluid coolant into the second pumping chamber, and transitioning of the at least one diaphragm to the second position pumps second fluid coolant from the second pumping chamber while concurrently drawing first fluid coolant into the first pumping chamber. The method further includes employing the actuator to vibrate the at least one diaphragm between the first position and the second position, wherein the vibrating continuously alternately: pumps first fluid coolant from the first pumping chamber while concurrently drawing second fluid coolant into the second pumping chamber; and pumps second fluid coolant from the second pumping chamber while concurrently drawing first fluid coolant into the first pumping chamber.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 9 is a cross-sectional elevational view of an alternate embodiment of a dual-chamber fluid pump, in accordance with an aspect of the present invention;

FIG. 10 is a graph of transient flow characteristics depicting continuous outflow of fluid from and continuous inflow of fluid to the dual-chamber fluid pump of FIG. 9, in accordance with an aspect of the present invention;

BEST MODE FOR CARRYING OUT THE INVENTION

Figure 1:
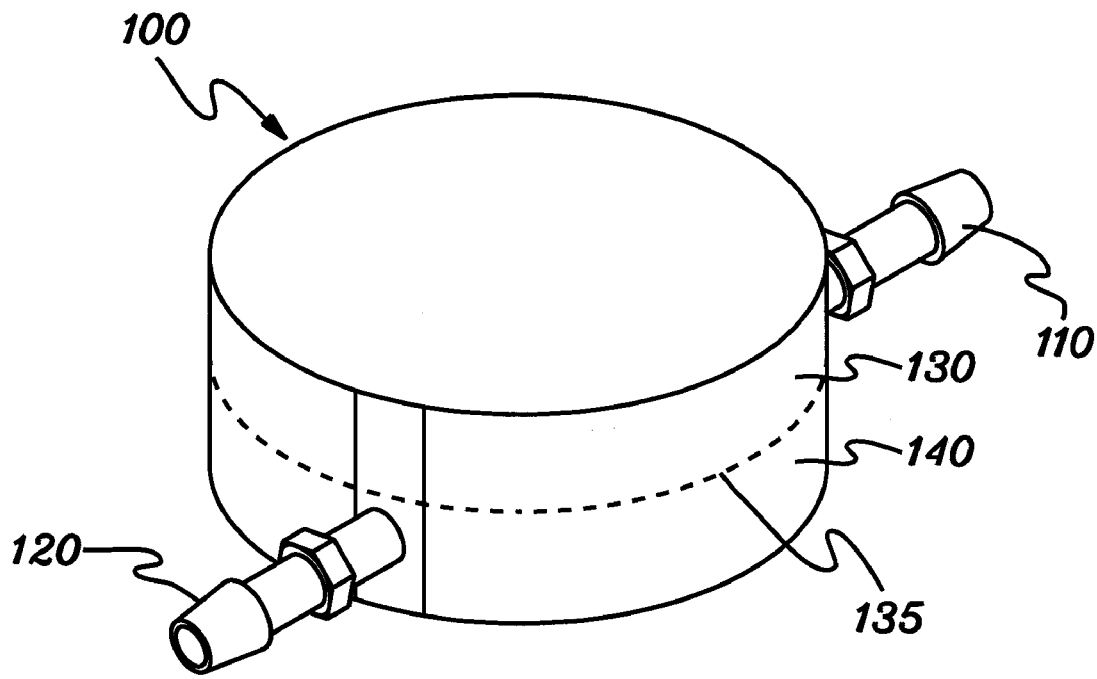
FIG. 1 is an isometric view of one embodiment of a conventional piezoelectric fluid pump.

As used herein "electronic device" comprises any heat generating electronic component of a computer system or other electronic system requiring cooling. In one example, the electronic device is or includes one or more integrated circuit chips, and/or electronic components. The term "fluid cooled electronic module" includes any electronic module with liquid cooling and at least one electronic device, with single-chip modules and multi-chip modules being examples of a cooled electronic module as described herein. The "surface to be cooled" refers to a surface of one or more electronic devices, or to an exposed surface of a thermal cap, thermal spreader, passivation layer, or other surface in contact with the one or more electronic devices, and through which heat generated by the electronic device(s) is to be extracted.

Generally stated, provided herein is an enhanced dual-chamber fluid pump and cooled electronics system and method employing the enhanced pump. In one embodiment, the pump includes a first fluid path for pumping a first fluid coolant and a second fluid path for pumping a second fluid coolant, with the first fluid path comprising a first pumping chamber and the second fluid path comprising a second pumping chamber. The pumping chambers are separated by at least one diaphragm and an actuator is coupled to the diaphragm(s) for transitioning the diaphragm(s) between a first position and a second position. Transitioning of the diaphragm(s) to the first position pumps first fluid coolant from the first pumping chamber while concurrently drawing second fluid coolant into the second pumping chamber, and transitioning of the diaphragm(s) to the second position pumps second fluid coolant from the second pumping chamber while concurrently drawing first fluid coolant into the first pumping chamber. The dual-chamber fluid pump is particularly advantageous when employed in a cooled electronics system comprising a multi-fluid cooled electronics module such as described in the above-incorporated, co-filed U.S. patent application entitled, "Multi-Fluid Cooling System, Cooled Electronics Module, and Methods of Fabrication Thereof". However, those skilled in the art will note that the dual-chamber fluid pump described herein has many applications in the art, including an ability to pump two different fluid coolants to two different fluid cooled electronics modules.

Two cooling solutions for addressing high heat flux in electronic devices are indirect liquid cooling via a cold plate and direct liquid cooling employing a manifold structure. In either approach, the cooling system requires a pump (or coolant flow drive apparatus) to move fluid coolant through the system. Designing pumps for such high performance liquid cooling systems requires substantial attention to attributes such as the ability to generate the requisite pressure head and coolant flow rate, and the size and the reliability of the pumps. Piezoelectric pumps are a viable option for applications where moderate flow rate and pressure head, small form factor, and high reliability are desirable characteristics.

FIG. 1 depicts an example of a conventional piezoelectric pump, generally denoted 100, implementations of which are commercially available through Deak Technologies, Inc., of Brooklyn, N.Y., USA. Piezoelectric pump 100 includes a fluid inlet port 110 and a fluid exit port 120. A lower chamber 140 within the pump is filled with fluid and in fluid communication with fluid inlet port 110 and fluid exit port 120. A diaphragm 135 divides lower chamber 140 from an upper chamber 130 filled with air, with appropriate vents (not shown) being provided to upper chamber 130.

Figure 2:
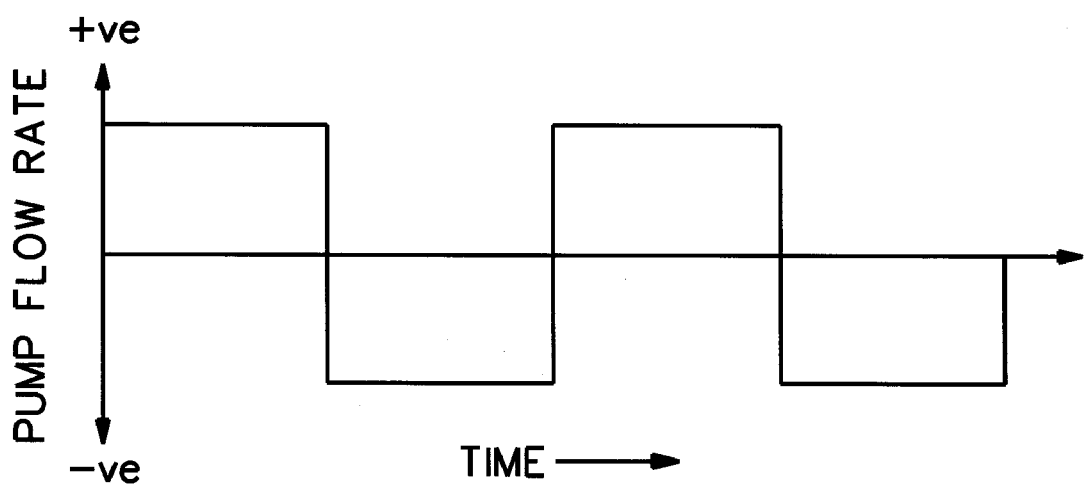
FIG. 2 is a graph of the transient flow characteristics for the conventional piezoelectric fluid pump of FIG. 1.

Upper chamber 130 of pump 100 houses a piezoelectric actuator (not shown) attached to diaphragm 135, which again separates the liquid-filled lower chamber 140 from the air-filled upper chamber 130. The actuator, along with the diaphragm, physically deflect when the actuator is energized by an oscillating voltage, with the maximum deflection being at the center. For half an operational cycle, the actuator and diaphragm deflect to a maximum position in one direction normal to the plane of the actuator, and in the following half of the cycle, the actuator and diaphragm deflect to a maximum position in the opposite direction. One-way valves in fluid inlet port 110 and fluid exit port 120 ensure that fluid only flows through the inlet port and out from the exit port. The resulting flow characteristic of the pump is plotted in FIG. 2. As shown, pump 100 provides fluid output (i.e., positive outflow) only one-half of the time. The other half of the operational cycle is devoted to drawing fluid into the liquid-filled lower chamber.

The enhanced pump presented herein address two limitations to the single-fluid chamber pump design of FIG. 1, namely: the ability to pump only a single type of fluid; and the ability to pump fluid for only one-half the total time, with only one-half of the total actuator deflection or transition being utilized to pump fluid out.

Figure 3:
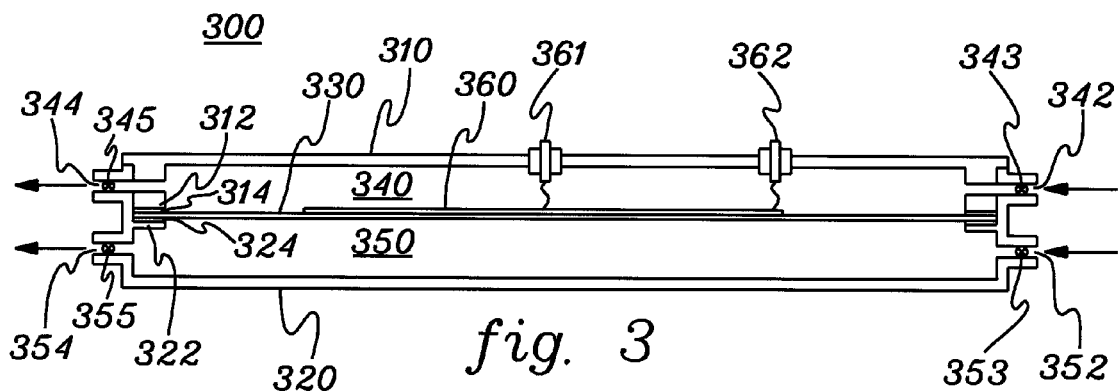
FIG. 3 is a cross-sectional elevational view of one embodiment of a dual-chamber fluid pump, in accordance with an aspect of the present invention.

FIG. 3 depicts one embodiment of a dual-chamber fluid pump 300, in accordance with an aspect of the present invention. Pump 300 includes an upper casing 310 and a lower casing 320 configured to sealably engage and define a first (e.g., upper) pumping chamber 340 and a second (e.g., lower) pumping chamber 350 separated by a diaphragm 330. More particularly, upper casing 310 defines an upper seat 312 along the periphery thereof, while lower casing 320 includes an inwardly projecting lower seat 322. A circular upper gasket 314 and a circular lower gasket 324 are disposed on either side of the diaphragm, and are sized to accommodate and secure a peripheral edge of diaphragm 330 therebetween when positioned between the diaphragm and a respective one of the upper and lower seats. Upper gasket 314 and lower gasket 324 further function to fluidically isolate fluid flow through the first pumping chamber 340 from fluid flow through the second pumping chamber 350.

A first fluid path is defined across the upper portion of pump 300 through a first fluid inlet 342, first pumping chamber 340, and a first fluid outlet 344, which are all in fluid communication as shown. First fluid inlet 342 and first fluid outlet 344 each include a check valve 343, 345, respectively, which together ensure unidirectional fluid flow through the first fluid path from the first fluid inlet, through the first pumping chamber and out through the first fluid outlet.

Similarly, a second fluid path is defined across the lower portion of pump 300 through a second fluid inlet 352, second pumping chamber 350, and a second fluid outlet 354, which are also all in fluid communication as shown. Again, second fluid inlet 352 includes a check valve 353, and second fluid outlet 354 includes a check valve 355, which cooperate to ensure unidirectional fluid flow through the second fluid path from the second fluid inlet, through the second pumping chamber and out through the second fluid outlet.

In this embodiment, the actuator is (by way of example) a piezoelectric actuator, with a first terminal post 361 and a second terminal post 362 providing input voltage to piezoelectric material 360 coupled to diaphragm 330. As is understood in the art, piezoelectric material 360 expands or contracts when voltage is applied across it. This phenomenon is employed to transition diaphragm 330 between a first and second position, as explained further below with reference to FIGS. 4 & 5. Further, first pumping chamber 340 is filled, in one example, with a dielectric coolant, and second pumping chamber 350 is filled with an aqueous coolant. Thus, the electrical wiring connections to the actuator reside in the first pumping chamber, which provides for an electrically inert environment (i.e., the dielectric fluid). Alternatively, if second pumping chamber 350 includes a dielectric fluid, then the piezoelectric actuator could be designed to reside in second pumping chamber 350.

Figure 4:
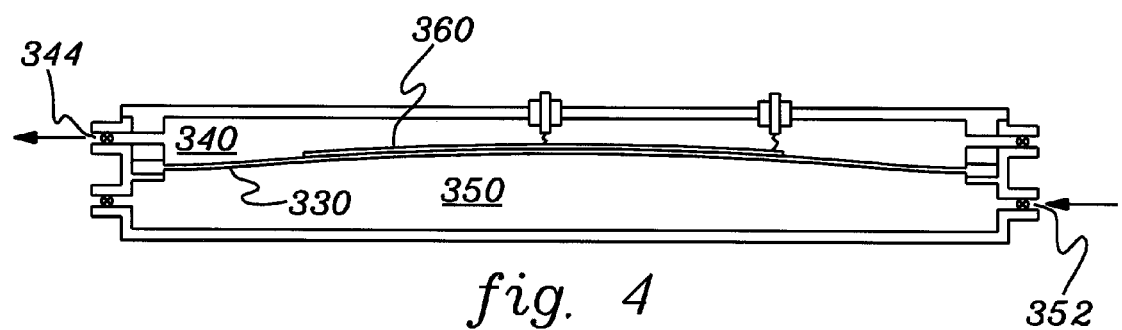
FIG. 4 is a cross-sectional elevational view of the dual-chamber fluid pump of FIG. 3, showing transitioning of the diaphragm to a first position resulting in concurrent pumping of a first fluid coolant from a first (e.g., upper) pumping chamber and drawing of a second fluid coolant into a second (e.g., lower) pumping chamber, in accordance with an aspect of the present invention.
Figure 6A:
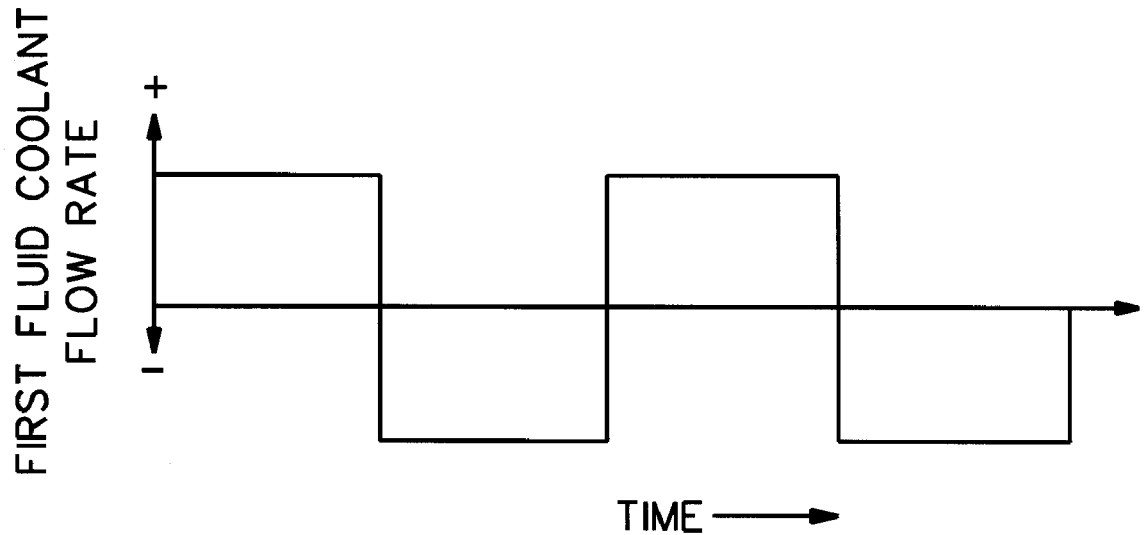
FIG. 6A is a graph of transient flow characteristics of the first fluid coolant flow rate versus time through the first fluid flow path (comprising the first pumping chamber), in accordance with an aspect of the present invention.
Figure 6B:
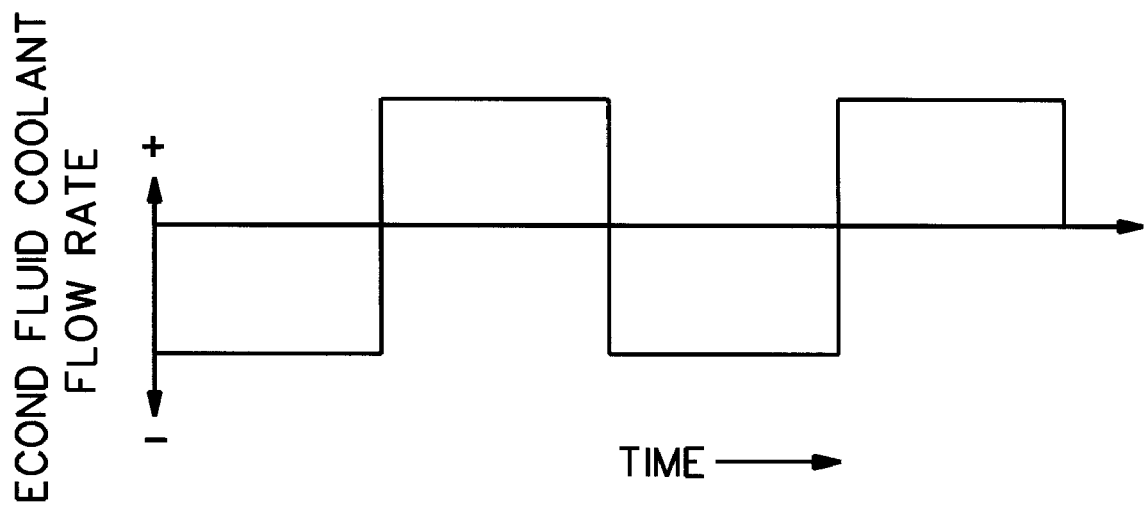
FIG. 6B is a graph of transient flow characteristics of the second fluid coolant flow rate versus time through the second fluid flow path (comprising the second pumping chamber), in accordance with an aspect of the present invention.

Operationally, in one example, actuator 360 is configured to transition diaphragm 330 in a first half of the operational cycle to a first (convex) position shown in FIG. 4 to pump first fluid coolant from first pumping chamber 340 via first fluid outlet 344 and to draw second fluid coolant into second pumping chamber 350 via second fluid inlet 352. This first half of the operational cycle is depicted in FIGS. 6A & 6B, wherein in FIG. 6A, positive outflow of first fluid coolant is shown and in FIG. 6B, inflow of second fluid coolant into the pump is shown occurring concurrent therewith. More particularly, by deflecting the diaphragm towards the first pumping chamber (see FIG. 4), pressure rises in the first pumping chamber, resulting in the opening of the one-way valve at first fluid outlet 344 and the pumping out of the first fluid coolant from the first pumping chamber under pressure. Concurrent with this, pressure in the second pumping chamber is reduced due to the increased volume in the chamber, thus resulting in the opening of the one-way valve at the second fluid inlet 352, which in turn results in second fluid coolant flow into the second pumping chamber. During this operation, the one-way valves at the first fluid inlet 342 and second fluid outlet 354 remain closed.

Figure 5:
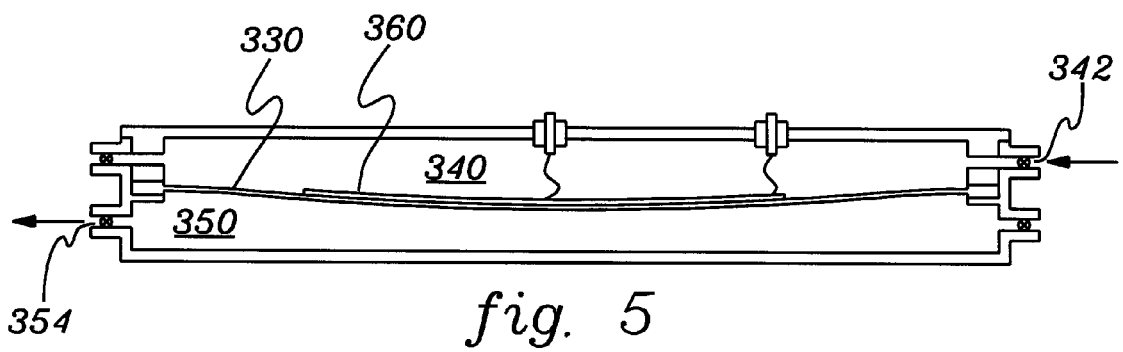
FIG. 5 is a cross-sectional elevational view of the dual-chamber fluid pump of FIGS. 3 & 4, showing transitioning of the diaphragm to a second position resulting in concurrent pumping of the second fluid coolant from the second pumping chamber and drawing of the first fluid coolant into the first pumping chamber, in accordance with an aspect of the present invention.

FIG. 5 depicts transitioning of diaphragm 330 to a second, concave position in the remainder of the operational pump cycle. During the second half of the cycle, diaphragm 330 deflects or returns to a lower extreme position and the first fluid coolant is drawn into first pumping chamber 340 through first fluid inlet 342, while the second fluid coolant is pumped from second pumping chamber 350 through second fluid outlet 354. This is again shown in the coolant flow rate diagrams of FIGS. 6A & 6B, wherein in the second half of the operational cycle, FIG. 6A illustrates the first fluid coolant inflow into the first pumping chamber, while FIG. 6B illustrates positive second fluid coolant outflow from the second pumping chamber. This inflow/outflow process then repeats for each operational cycle of the pump.

By way of specific example, the piezoelectric actuator is a piezoelectric disk-shaped actuator made of Barium Titanate (ceramic $BaTiO_3$) or Lead Zirconate Titanate (ceramic PZT), which are both manufactured by Ecertec Limited, of Leeds, United Kingdom. PZT is also fabricated by American Piezo Ceramics, Inc., of Mackeyville, Pa., USA. An electrical potential of several hundred volts of alternating voltage (e.g., 100-1,000 VDC) creates a deflection of 0.025-0.1 mm in a 25 mm diameter disk. This device will typically be operated at frequencies of several hundred cycles per second. The disk-shaped actuator is bonded to the larger disk-shaped diaphragm (e.g., membrane) using an adhesive or bonding agent. The diaphragm may be made of a polymeric material. Alternatively, the piezoelectric material need not be ceramic, but a polymeric material such as a fluoropolymer, e.g., Polyvinylidene Fluoride (PVDF) made in powder form by SOLVAY Advanced Polymers, LLC, of Alpharetta, Ga., USA.

Although principally described herein as a piezoelectric actuator with a piezoelectric material which deforms when subjected to an electrical potential across the material, other actuation mechanisms could be employed to transition the diaphragm between a first position and second position. For example, shape memory alloys which deform when heated or cooled could be employed, with the heating performed by joule heating from the passage of an electric current through the actuator. An example of this material is Nickel-Titanium alloy such as Nitinol offered by Memry Corp., of Bethel, Conn., USA. Alternatively, magnetic fields could be employed to cause dynamic deflection of the membrane using materials such as magneto-restrictive materials. An example of a magneto-restrictive material is Terfonal-D (an alloy of Terbium, Dysprosium, and Iron), fabricated by ETREMA Products, Inc., of Ames, Iowa, USA.

Figure 7:
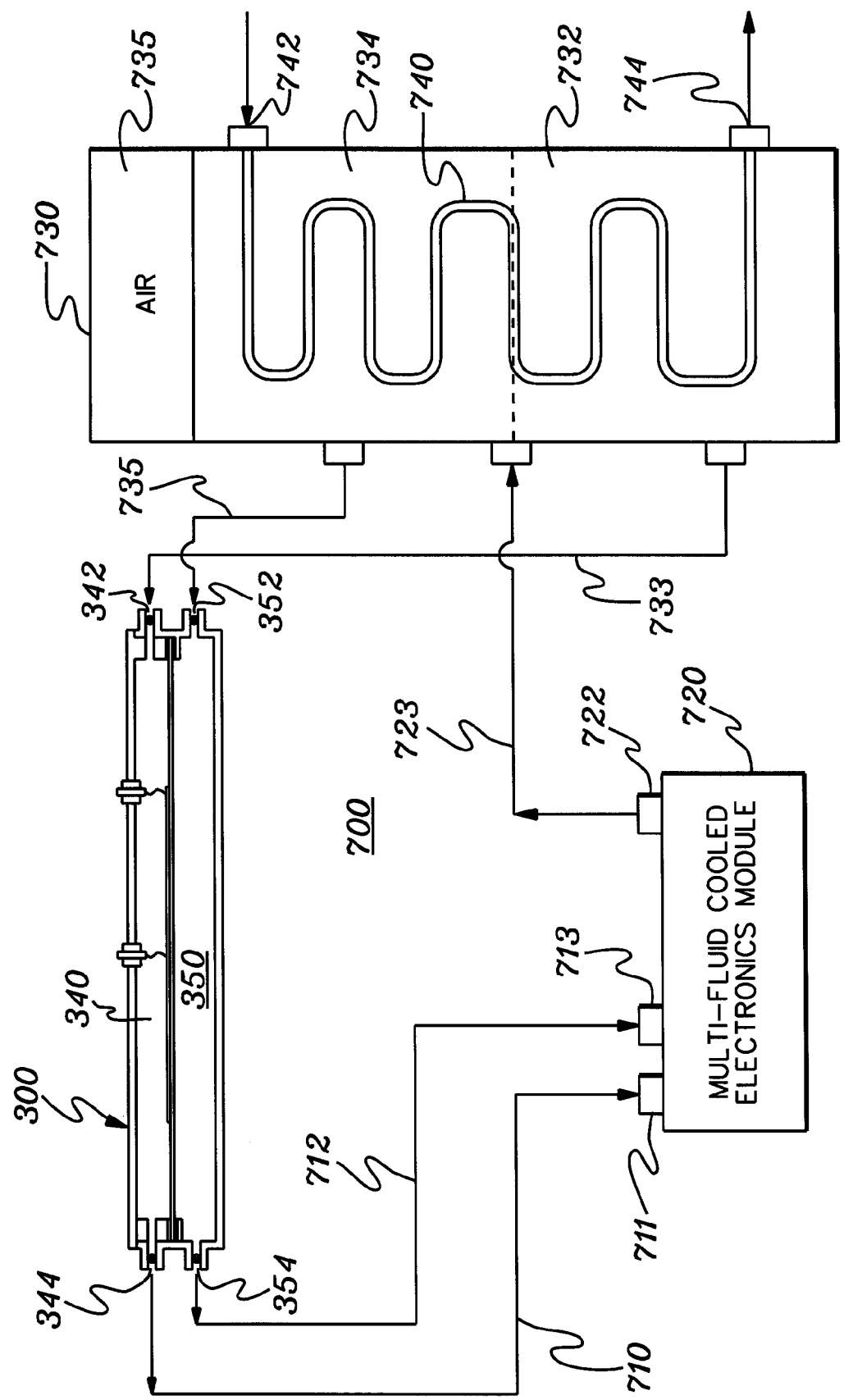
FIG. 7 depicts one embodiment of a cooled electronics system, in accordance with an aspect of the present invention.

FIG. 7 depicts one embodiment of a cooled electronics system 700, in accordance with an aspect of the present invention. In this embodiment, a dual-chamber fluid pump 300, such as described above in connection with FIGS. 3-5, is employed to circulate a first fluid coolant and a second coolant fluid, which by way of example, are a dielectric coolant, and an aqueous coolant, respectively. The two different fluids are provided to a multi-fluid cooled electronics module 720 such as described above in the incorporated, co-filed patent application entitled, "Multi-Fluid Cooling System, Cooled Electronics Module, and Methods of Fabrication Thereof". Briefly summarized, this incorporated application describes enhanced cooling systems and methods of cooling which allow for high heat transfer from a surface of an electronic device to be cooled using a direct multi-fluid impingement approach. The multi-fluid coolants include a first fluid (i.e., a first liquid) and a second fluid (i.e., a second liquid), which are immiscible and have different densities. Additionally, the first fluid has a significantly lower boiling point temperature than the second fluid. The multi-fluid cooled electronics module includes a manifold structure comprising a first fluid inlet orifice and a second fluid inlet orifice for concurrently separately injecting the first fluid and the second fluid in close association with one another onto a surface to be cooled. When the cooling system is employed to cool one or more electronic devices and the first fluid boils, evolving first fluid vapor condenses in situ over the surface to be cooled by direct contact with the second fluid of higher boiling point temperature. By way of specific example, the first fluid may comprise a fluorocarbon, a segregated hydrofluoroether (HFE) or a refrigerant, and the second fluid, water.

As shown in FIG. 7, cooled electronics system 700 includes, in addition to multi-fluid cooled electronics module 720 and dual-chamber fluid pump 300, a reservoir 730 which functions as a fluid separator and a heat exchanger. An effluent comprising an emulsion of the first fluid coolant and the second fluid coolant is output through an exit port 722 in multi-fluid cooled electronics module 720 to reservoir 730 via a multi-fluid return line 723. The emulsion comprises separate globules of the dielectric fluid and water, which due to their immiscibility and different specific gravities, separate into two distinct layers or volumes 732, 734 within reservoir 730, with the dielectric at the bottom of the reservoir and water at the top. An air space 735 and a pressure relief valve (not shown) are also provided within reservoir 730 to ensure maintenance of pressure within the reservoir below a set limit.

As shown, reservoir 730 also functions as a heat exchanger with at least one cooling loop 740 passing therethrough between a coolant inlet 742 and a coolant outlet 744. Cooled dielectric fluid is drawn from the reservoir via a supply line 733 to first fluid inlet 342 of dual-chamber fluid pump 300, while cooled water is drawn from the reservoir via supply line 735 to second fluid inlet 352 of dual-chamber fluid pump 300. Supply lines 733 and 735 couple to reservoir 730 at levels of the tank always below and always above, respectively, the dielectric-water interface.

Dual-chamber fluid pump 300 simultaneously circulates dielectric fluid through the first flow path (comprising first pumping chamber 340) and water through the second flow path (comprising second pumping chamber 350), as explained above. The two fluids are respectively provided (via a first coolant loop 710) to a first fluid inlet 711 of multi-fluid cooled electronics module 720 and (via a second coolant loop 712) to a second fluid inlet 713 of multi-fluid cooled electronics module 720. In operation, heat from the one or more electronic devices within electronics module 720 is rejected to the first and second fluid coolants passing therethrough, which in turn reject the heat at the reservoir to, for example, chilled water passing through the cooling loop of the heat exchanger. In one example, this chilled water could be supplied by a coolant distribution unit or computer room water conditioning unit.

Figure 8:
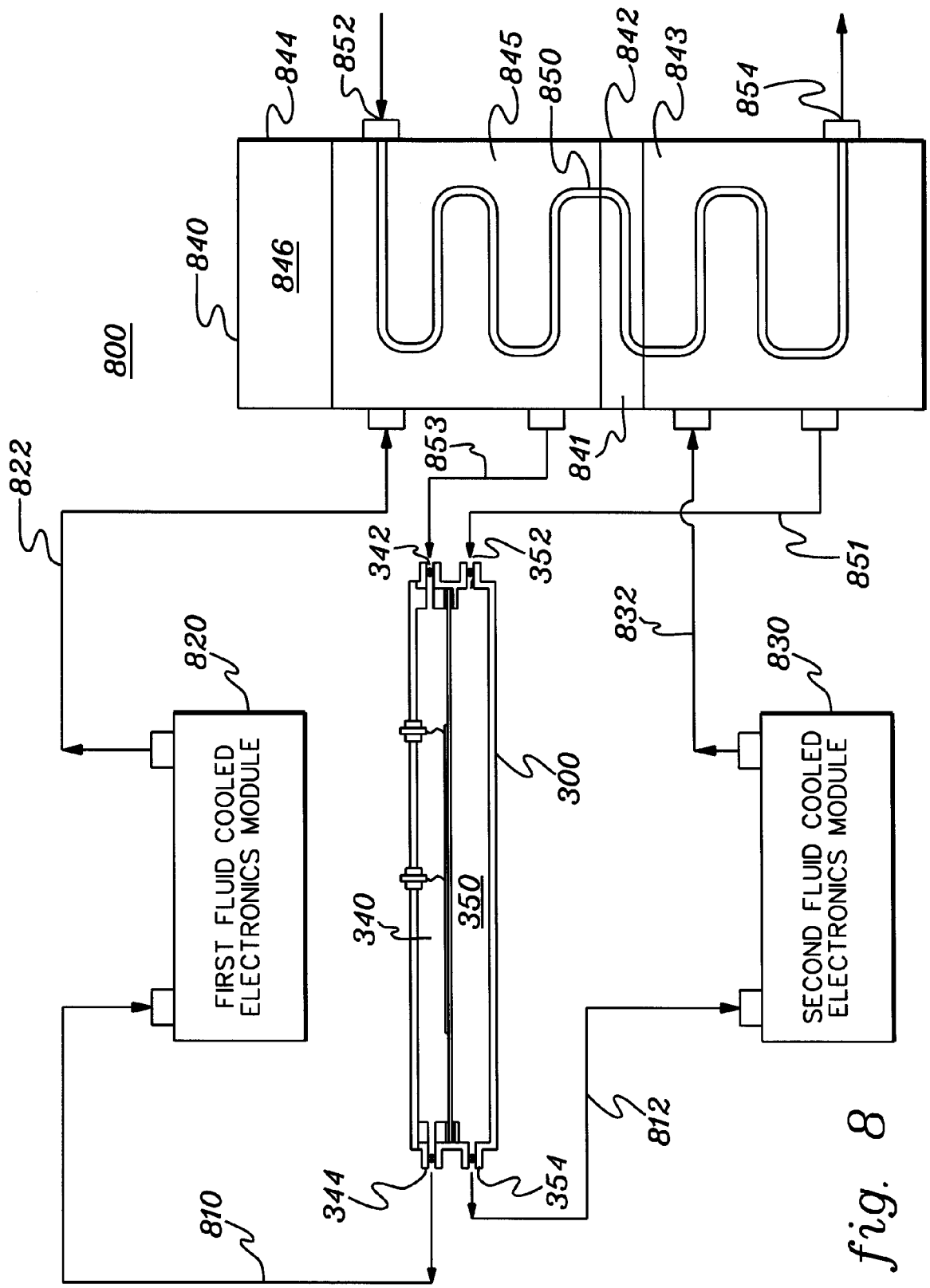
FIG. 8 depicts an alternate embodiment of a cooled electronics system, in accordance with an aspect of the present invention.

FIG. 8 depicts an alternate implementation of a cooled electronics system 800 employing a dual-chamber fluid pump 300, in accordance with an aspect of the present invention. In this electronics system, a first fluid cooled electronics module 820 and a second fluid cooled electronics module 830 are both supplied with coolant from a single dual-chamber fluid pump 300 (such as described above in connection with FIGS. 3-5), with both coolant loops being isolated from one another and containing a same type or different types of coolant.

As shown in FIG. 8, a first fluid coolant is pumped from first pumping chamber 340 through first fluid outlet 344 (via a first fluid loop 810) to first fluid cooled electronics module 820, and a second fluid coolant is pumped from second pumping chamber 350 through second fluid outlet 355 (via a second cooling loop 812) to second fluid cooled electronics module 830. The heated first fluid coolant from first fluid cooled electronics module 820 is returned via return line 822 to a first portion 844 of a reservoir 840, and the heated second fluid coolant is returned via a return line 832 to a second portion 842 of reservoir 840. Portions 844 and 842 are assumed to be isolated portions of reservoir 840, which again in this example, also functions as a heat exchanger with at least one coolant flow path 850 passing through both portions of the reservoir. First fluid coolant 845 substantially fills first reservoir portion 844, except for an air space 846 (with a pressure relief valve (not shown) to ensure maintenance of pressure within the reservoir portion 844 below a set limit), while second fluid 843 substantially fills second reservoir portion 842, except for an air space 841 (and a pressure relief valve (not shown), again to ensure maintenance of pressure within reservoir portion 842 below a set limit). Coolant is fed through the heat exchanger cooling loop 850 from a coolant inlet 852 to a coolant outlet 854. By way of example, the chilled coolant passing through the heat exchanger could comprise chilled water supplied by a coolant distribution unit or a computer room water conditioning unit.

A first supply line 853 couples reservoir portion 844 to first fluid inlet 342 of dual-chamber fluid pump 300, for drawing of the first fluid coolant to the first fluid path of the pump, and a second supply line 851 couples reservoir portion 842 to second fluid inlet 352 of dual-chamber fluid pump 300 for drawing of the second fluid coolant to the second fluid path of the pump. By way of example, the first fluid coolant passing through the first fluid cooled electronics module 820 is a dielectric, while the second fluid coolant passing through second fluid cooled electronics module 830 is water. Advantageously, this allows use of a piezoelectric actuator to drive the diaphragm separating the first pumping chamber 340 from the second pumping chamber 350, with the electrical lines coupling to the piezoelectric material passing through the first pumping chamber as illustrated in FIG. 8. Operation of pump 300 is again analogous to that described above in connection with FIGS. 3-5.

FIG. 9 depicts an alternate embodiment of a dual-chamber fluid pump, in accordance with an aspect of the present invention. This fluid pump 900 includes an upper casing 910 and a lower casing 920, which together with a first diaphragm 930 and a second diaphragm 940 define a first pumping chamber 950 and a second pumping chamber 960. A first fluid path is defined in the upper portion of dual-chamber fluid pump 900 through a first fluid inlet 952, first pumping chamber 950 and a first fluid outlet 954, while a second fluid path is defined in the lower portion of dual-chamber fluid pump 900 through second fluid inlet 962, second pumping chamber 960 and a second fluid outlet 964. One-way valves 953 & 955 ensure unidirectional flow of a first fluid coolant through the first fluid path, and one-way valves 963, 965 ensure unidirectional flow of a second fluid coolant through the second fluid path.

Upper casing 910 includes a perimeter surface 912 which functions as an upper seat, and lower casing 920 includes an inwardly projecting lower seat 922, between which the first and second diaphragms 930 & 940 are held along their perimeters. In one example, the upper and lower diaphragms are disk-shaped and are held in spaced relation between an epoxy material 980 (sandwiched between the diaphragms) and an upper circular gasket 914 (sandwiched between the upper seat and the upper diaphragm) and a lower circular gasket 924 (sandwiched between the lower seat and the lower diaphragm). Epoxy material 980 functions to seal the space between the diaphragms holding the piezoelectric material 970 of a piezoelectric actuator. In this example, a first terminal post 971 provides electrical connection to a perimeter of piezoelectric material 970, while a second terminal post 972 electrically connects to a middle portion of piezoelectric material 970. By applying an alternating voltage across the first terminal post and second terminal post, piezoelectric material 970 transitions causing first membrane 930 and second membrane 940 to vibrate together, thereby alternately effecting pumping of first fluid coolant from first pumping chamber 950 and second fluid coolant from second pumping chamber 960.

Advantageously, in the FIG. 9 embodiment, the two diaphragms attach to the same piezoelectric actuator, and the electrical wiring for the actuator is isolated from both the first pumping chamber and the second pumping chamber. Thus, the first fluid coolant in the first pumping chamber and the second fluid coolant in the second pumping chamber may each be an aqueous coolant. Thus, in one embodiment, the two chambers can supply the same coolant (for example, water), to different loops passing through different fluid-cooled electronic modules, or can be connected together at their outlets and at their inlets, thus enabling twice the flow rate than possible with a comparably sized conventional piezoelectric pump. This flow characteristic is depicted in FIG. 10, where a constant flow rate of fluid is pumped from the dual-chamber fluid pump and a constant rate of fluid is drawn into the dual-chamber fluid pump, again when viewed from where the pump outlets are connected together, and the pump inlets are connected together.

Figure 11:
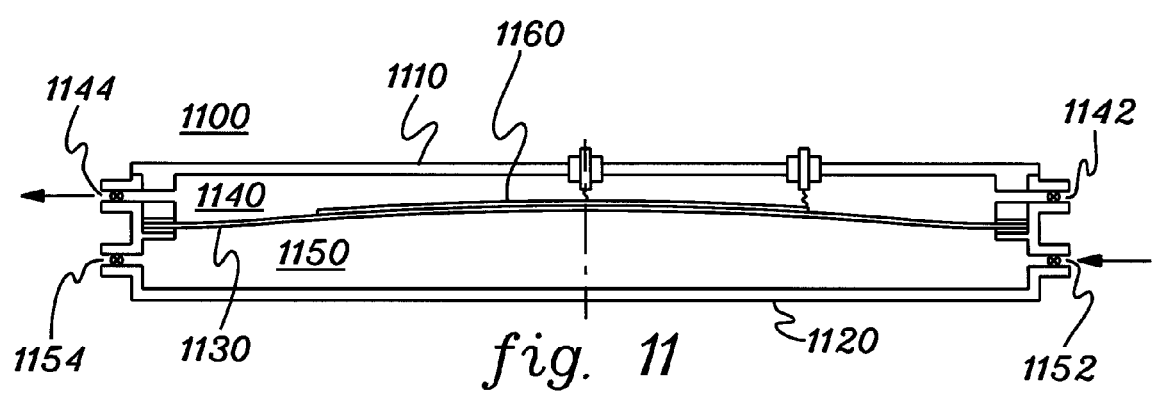
FIG. 11 is a cross-sectional elevational view of another embodiment of a dual-chamber fluid pump, showing the diaphragm in a first position to pump a first fluid coolant from the first pumping chamber and concurrently draw a second fluid coolant into the second pumping chamber, in accordance with an aspect of the present invention.
Figure 12:
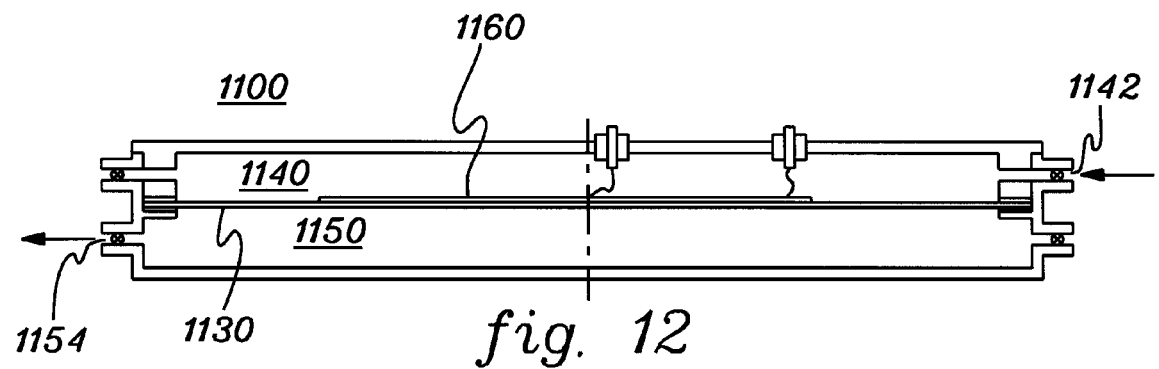
FIG. 12 depicts the dual-chamber fluid pump of FIG. 11, showing the diaphragm in a second position to pump second fluid coolant from the second pumping chamber and concurrently draw first fluid coolant into the first pumping chamber, in accordance with an aspect of the present invention.

FIGS. 11 & 12 depict a further alternate embodiment of a dual-chamber fluid pump 1100, in accordance with an aspect of the present invention. In this embodiment, the pump again includes an upper casing 1110 and a lower casing 1120 which, along with diaphragm 1130, define a first pumping chamber 1140 and a second pumping chamber 1150. The upper and lower casings are configured to define seats along the periphery of the diaphragm 1130 which hold the diaphragm in position employing upper and lower circular gaskets, as explained above in connection with the embodiments of FIGS. 3-5. A first fluid path is defined through the upper portion of the pump from a first fluid inlet 1142, through first pumping chamber 1140, and out a first fluid outlet 1144, while a second fluid path is defined from a second fluid inlet 1152, through second pumping chamber 1150, and out a second fluid outlet 1154. In this embodiment, the diaphragm transitions between a first position, shown to be a convex position in FIG. 11, and a second position, shown to be a planar position in FIG. 12. As shown in FIG. 11, in the first position, first fluid coolant is pumped from first pumping chamber 1140 out first fluid outlet 1144, while concurrently second fluid coolant is drawn into second pumping chamber 1150 through second fluid inlet 1152. Conversely, as shown in FIG. 12, in the second diaphragm position, second fluid coolant is pumped from second pumping chamber 1150 out second fluid outlet 1154, while first fluid coolant is concurrently drawn into first pumping chamber 1140 through first fluid inlet 1142. The actuation mechanism is again, in one example, a piezoelectric actuator 1160, with the first fluid coolant passing through the first fluid path being a dielectric and the second fluid coolant passing through the second fluid path being water.

Those skilled in the art will note from the above description that provided herein is a dual-chamber fluid pump for an electronics cooling system and method, wherein the two fluid paths are isolated and, in one embodiment, occupied by two different coolants. Thus, a single dual-chamber fluid pump can supply two different fluid coolants for cooling a single electronics module or for cooling at least two different electronics modules. Depending on the implementation, the cooled electronics system can include a common reservoir which also functions as a heat exchanger for the two different fluid coolants provided to the dual-chamber fluid pump. By way of specific example, one fluid coolant is a dielectric fluid, while the other fluid coolant is aqueous. Driving of the diaphragm separating the pumping chambers can be accomplished employing a piezoelectric material to vibrate the diaphragm. In such an implementation, the piezoelectric material and electrical connections can reside in the pumping chamber containing the dielectric coolant. As a further variation, two diaphragms may be employed sandwiching an actuation mechanism, which when stimulated, causes vibration of the diaphragms to alternately discharge and draw in fluid coolant to the two different pumping chambers. Additional advantages of the structures and processes described herein will be apparent to those of ordinary skill in the art.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A cooled electronics system comprising:
   a multi-fluid cooled electronics module, the multi-fluid cooled electronics module being cooled by a first fluid coolant received at a first inlet thereof and a second fluid coolant received at a second inlet thereof, wherein the first fluid coolant and the second fluid coolant are immiscible and have different densities;

at least one heat exchanger for cooling fluid effluent from the multi-fluid cooled electronics module, the fluid effluent comprising the first fluid coolant and the second fluid coolant;

a pump for providing the first fluid coolant and the second fluid coolant to the multi-fluid cooled electronics module from the heat exchanger, the pump comprising:

a first fluid path for pumping the first fluid coolant and a second fluid path for pumping the second fluid coolant, the first fluid path comprising a first pumping chamber and the second fluid path comprising a second pumping chamber;

at least one diaphragm separating the first pumping chamber and the second pumping chamber; and an actuator coupled to the at least one diaphragm for transitioning the at least one diaphragm between a first position and a second position, wherein transitioning of the at least one diaphragm to the first position pumps first fluid coolant from the first pumping chamber while concurrently drawing second fluid coolant into the second pumping chamber, and transitioning of the at least one diaphragm to the second position pumps second fluid coolant from the second pumping chamber while concurrently drawing first fluid coolant into the first pumping chamber.

2. The cooled electronics system of claim 1, wherein the actuator is a piezoelectric actuator, the piezoelectric actuator comprising a piezoelectric material coupled to the at least one diaphragm.

3. The cooled electronics system of claim 1, wherein the first fluid path further comprises a first fluid inlet and a first fluid outlet in fluid communication with the first pumping chamber, and the second fluid path comprises a second fluid inlet and a second fluid outlet in fluid communication with the second pumping chamber, wherein the first fluid inlet, the first fluid outlet, the second fluid inlet and the second fluid outlet each have associated therewith a respective check valve to ensure that first fluid coolant flow through the first fluid path is unidirectional from the first fluid inlet out through the first fluid outlet and second fluid coolant flow through the second fluid path is unidirectional from the second fluid inlet out through the second fluid outlet.

4. The pump cooled electronics system of claim 1, wherein the first pumping chamber is a first cylindrical pumping chamber and the second pumping chamber is a second cylindrical pumping chamber, and wherein the at least one diaphragm comprises a disk-shaped diaphragm isolating the first cylindrical pumping chamber from the second cylindrical pumping chamber, and wherein the actuator comprises a piezoelectric actuator, the piezoelectric actuator comprising a disk-shaped piezoelectric material attached to the disk-shaped diaphragm and electrical wiring connecting to the disk-shaped piezoelectric material, the electrical wiring extending through one of the first cylindrical pumping chamber and the second cylindrical pumping chamber.

5. The pump cooled electronics system of claim 1, wherein the pump further comprises an upper casing and a lower casing sealed together along the peripheries thereof, wherein the upper casing and the at least one diaphragm define the first pumping chamber, and the lower casing and the at least one diaphragm define the second pumping chamber, and wherein the upper casing includes an upper seat for the at least one diaphragm and the lower casing includes a lower seat for the at least one diaphragm and wherein the at least one diaphragm is coupled to the upper casing by an upper circular gasket disposed between the at least one diaphragm and the upper seat of the upper casing and is coupled to the lower casing by a lower circular gasket disposed between the at least one diaphragm and the lower seat of the lower casing.

6. The cooled electronics system of claim 1, wherein the first fluid path through the pump is separate from the second fluid path, and wherein the cooled electronic system further comprises a first coolant loop coupling the first fluid path of the pump to a first inlet of the multi-fluid cooled electronics module and a second coolant loop coupling the second fluid path of the pump to a second inlet of the multi-fluid cooled electronics module.

7. The cooled electronics system of claim 6, wherein the first fluid coolant is a dielectric fluid and the second fluid coolant is an aqueous fluid, and wherein the actuator is a piezoelectric actuator extending partially into the first pumping chamber.

8. The cooled electronics system of claim 1, wherein multi-fluid cooled electronics module comprises the first inlet and the second inlet for respectively, separately receiving the first fluid coolant and the second fluid coolant, and wherein the first fluid coolant and the second fluid coolant form an emulsion within the housing.

9. The cooled electronics system of claim 8, wherein the first fluid coolant is a first liquid coolant and the second fluid coolant is a second liquid coolant.

10. A cooled electronics system comprising:

at least one fluid cooled electronics module;

at least one heat exchanger for cooling fluid effluent from the at least one fluid cooled electronics module, the fluid effluent comprising a first fluid coolant and a second fluid coolant;

a pump for providing the first fluid coolant and the second fluid coolant to the at least one fluid cooled electronics module from the at least one heat exchanger, the pump comprising:

a first fluid path for pumping the first fluid coolant and a second fluid path for pumping the second fluid coolant, the first fluid path comprising a first pumping chamber and the second fluid path comprising a second pumping chamber;

at least one diaphragm separating the first pumping chamber and the second pumping chamber;

an actuator coupled to the at least one diaphragm for transitioning the at least one diaphragm between a first position and a second position, wherein transitioning of the at least one diaphragm to the first position pumps first fluid coolant from the first pumping chamber while concurrently drawing second fluid coolant into the second pumping chamber, and transitioning of the at least one diaphragm to the second position pumps second fluid coolant from the second pumping chamber while concurrently drawing first fluid coolant into the first pumping chamber;

wherein the at least one fluid cooled electronics module comprises a dual-fluid cooled electronics module, and wherein the first fluid path through the pump is separate from the second fluid path, and wherein the cooled electronic system further comprises a first coolant loop coupling the first fluid path of the pump to a first inlet of the dual-fluid cooled electronics module and a second coolant loop coupling the second fluid path of the pump to a second inlet of the dual-fluid cooled electronics module; and wherein the first fluid coolant and the second fluid coolant are immiscible and have different densities, and wherein the at least one heat exchanger comprises a fluid separation tank, the fluid separation tank receiving as input the fluid effluent from the dual-fluid cooled electronics module, the fluid effluent comprising an emulsion of the first fluid coolant and the second fluid coolant, wherein the first fluid coolant and the second fluid coolant separate in the fluid separation tank based on their immiscibility and different densities, and are separately respectively drawn to a first fluid inlet of the first fluid path of the pump and a second fluid inlet of the second fluid path of the pump by operation of the pump.

11. A method of cooling multi-fluid cooled electronics module, the method comprising:

providing a pump for pumping a first fluid coolant and a second fluid coolant to the multi-fluid cooled electronics module, the pump comprising:

a first fluid path for pumping the first fluid coolant and a second fluid path for pumping the second fluid coolant, the first fluid path comprising a first pumping chamber and the second fluid path comprising a second pumping chamber;

at least one diaphragm separating the first pumping chamber and the second pumping chamber; and an actuator coupled to the at least one diaphragm for transitioning the at least one diaphragm between a first position and a second position, wherein transitioning of the at least one diaphragm to the first position pumps first fluid coolant from the first pumping chamber while concurrently drawing second fluid coolant into the second pumping chamber, and transitioning of the at least one diaphragm to the second position pumps second fluid coolant from the second pumping chamber while concurrently drawing first fluid coolant into the first pumping chamber; and employing the actuator to vibrate the at least one diaphragm between the first position and the second position, wherein the vibrating continuously alternately:

pumps first fluid coolant from the first pumping chamber while concurrently drawing second fluid coolant into the second pumping chamber; and pumps second fluid coolant from the second pumping chamber while concurrently drawing first fluid coolant into the first pumping chamber; and providing the first fluid coolant pumped from the first fluid path to a first inlet of the multi-fluid cooled electronics module and providing the second fluid coolant pumped from the second fluid path to a second inlet of the multi-fluid cooled electronics module, wherein the at least one multi-fluid cooled electronics module is cooled by the first fluid coolant and the second fluid coolant, the first fluid coolant and the second fluid coolant being immiscible and having different densities.

12. The method of claim 11, wherein the method further comprises providing a fluid separation tank, the fluid separation tank receiving as input fluid effluent from the dual-fluid cooled electronics module, the fluid effluent comprising an emulsion of the first fluid coolant and the second fluid coolant, wherein the first fluid coolant and the second fluid coolant separate in the fluid separation tank based on their immiscibility and different densities, and wherein the method further comprises cooling the first fluid coolant and the second fluid coolant within the fluid separation tank and separately drawing the first fluid coolant to a first fluid inlet of the first fluid path of the pump, and the second fluid coolant to a second fluid inlet of the second fluid path of the pump via the vibrating of the at least one diaphragm.

13. The method of claim 11, wherein the actuator is a piezoelectric actuator, the piezoelectric actuator comprising a piezoelectric material coupled to the at least one diaphragm, and wherein vibrating the at least one diaphragm is accomplished by applying an alternating electrical potential across the piezoelectric material to transition the at least one diaphragm between the first position and the second position.

\* \* \* \* \*